(12) United States Patent
Park

(10) Patent No.: US 12,369,415 B2
(45) Date of Patent: Jul. 22, 2025

(54) IMAGE SENSING DEVICE WITH MULTIPLE TRANSMISSION GATES FOR GLOBAL SHUTTER OPERATION

(71) Applicant: SK hynix Inc., Icheon-si (KR)

(72) Inventor: Soon Yeol Park, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 494 days.

(21) Appl. No.: 17/744,253

(22) Filed: May 13, 2022

(65) Prior Publication Data

US 2023/0027360 A1 Jan. 26, 2023

(30) Foreign Application Priority Data

Jul. 22, 2021 (KR) .................. 10-2021-0096597

(51) Int. Cl.
*H10F 39/00* (2025.01)
*H10F 39/18* (2025.01)

(52) U.S. Cl.
CPC ....... *H10F 39/80377* (2025.01); *H10F 39/18* (2025.01); *H10F 39/802* (2025.01)

(58) Field of Classification Search
CPC ......... H01L 27/14616; H01L 27/14603; H01L 27/14643; H01L 27/14609; H04N 25/59; H04N 25/76; H10F 39/80377; H10F 39/18; H10F 39/802; H10F 39/803
USPC ........................................ 257/292
See application file for complete search history.

(56) References Cited

U.S. PATENT DOCUMENTS

| 9,548,328 | B2 | 1/2017 | Hasegawa et al. |
| 2009/0316032 | A1* | 12/2009 | Misawa ............ H01L 27/14612 257/E21.21 |
| 2011/0248371 | A1* | 10/2011 | Matsumura ....... H10F 39/80373 257/443 |
| 2014/0346572 | A1* | 11/2014 | Chen ................. H01L 27/14614 257/229 |
| 2015/0069471 | A1* | 3/2015 | Kawamura .......... H10F 39/011 438/60 |
| 2016/0093659 | A1* | 3/2016 | Nakamura .......... H10F 39/8053 257/225 |
| 2016/0155774 | A1* | 6/2016 | Hasegawa ......... H01L 27/14638 257/231 |

(Continued)

FOREIGN PATENT DOCUMENTS

KR 20180081869 A 7/2018

*Primary Examiner* — Duy T Nguyen
(74) *Attorney, Agent, or Firm* — Perkins Coie LLP

(57) ABSTRACT

An image sensing device may include a photoelectric conversion region structured to convert incident light into photocharge, a first transmission gate structured to transfer the photocharge generated by the photoelectric conversion region to a first floating diffusion region structured to store the photocharge, and a second transmission gate structured to transfer the photocharge transferred to the first floating diffusion region to a second floating diffusion region structured to store the photocharge for readout, wherein a first side surface of the second transmission gate abuts on a side surface of the first transmission gate, the first floating diffusion region abuts on a bottom surface of the second transmission gate and the side surface of the first transmission gate, and the second floating diffusion region abuts on a second side surface of the second transmission gate facing away from the first side surface of the second transmission gate.

20 Claims, 8 Drawing Sheets

(56) References Cited

U.S. PATENT DOCUMENTS

2017/0104021 A1\* 4/2017 Park .................. H01L 27/14614
2018/0197910 A1\* 7/2018 Lee .................... H04N 25/7795

\* cited by examiner

IMAGE SENSING DEVICE WITH MULTIPLE TRANSMISSION GATES FOR GLOBAL SHUTTER OPERATION

CROSS-REFERENCES TO RELATED APPLICATION

This patent document claims the priority and benefits of Korean application number 10-2021-0096597, filed on Jul. 22, 2021, which is incorporated herein by reference in its entirety as part of the disclosure of this patent document.

TECHNICAL FIELD

The technology and implementations disclosed in this patent document generally relate to an image sensing device.

BACKGROUND

An image sensing device is a semiconductor device for capturing and converting light of optical images into electrical signals for displaying the captured images and for further processing of the captured images. The recent development of various industries and sectors, including automobile, medical, computer and communication industries, generates various demands for high-performance image sensing devices in various electronic devices such as a smart phone, digital camera, game machine, IOT (Internet of Things), robot, security camera and medical micro camera.

The image sensing devices may be roughly divided into a CCD (Charge Coupled Device) image sensing device and a CMOS (Complementary Metal Oxide Semiconductor) image sensing device. CCD image sensing devices provides a higher image quality than the CMOS image sensing device, but have a larger size and consume more power than the CMOS image sensing device. CMOS image sensing devices have a smaller size and consume less power than the CCD image sensing device. Furthermore, CMOS image sensing devices and signal processing circuitry can be integrated into a single chip, making it possible to miniaturize electronic devices while achieving reduction in production costs. Such characteristics make CMOS image sensing devices better suited for implementations in mobile devices.

SUMMARY

Various embodiments relate to an image sensing device that can perform a global shutter function without increasing its size.

In accordance with an embodiment of the disclosed technology, an image sensing device may comprise: a photoelectric conversion region structured to convert incident light into photocharge corresponding to an optical image of an object; a first transmission gate structured to transfer the photocharge generated by photoelectric conversion region to a first floating diffusion region structured to store the photocharge; and a second transmission gate structured to transfer the photocharge transferred to the first floating diffusion region to a second floating diffusion region structured to store the photocharge for readout, wherein a first side surface of the second transmission gate abuts on a side surface of the first transmission gate, the first floating diffusion region abuts on a bottom surface of the second transmission gate and the side surface of the first transmission gate, and the second floating diffusion region abuts on a second side surface of the second transmission gate facing away from the first side surface of the second transmission gate.

In some implementations, the first transmission gate is formed in a substrate and has a first length, the second transmission gate is formed in the substrate and has a second length, and wherein the first length is larger than the second length.

In some implementations, the image sensing device may further comprise a first channel abutting on the photoelectric conversion region, the first floating diffusion region and the first transmission gate.

In some implementations, the image sensing device may further comprise a second channel abutting on the first floating diffusion region, the second floating diffusion region and the second transmission gate.

In some implementations, the second channel may extend along a portion of the bottom surface of the second transmission gate and a portion of the second side surface of the second transmission gate.

In some implementations, the second transmission gate may have a larger width than the first floating diffusion region.

In some implementations, the first transmission gate may abut on at least a part of the photoelectric conversion region.

In some implementations, the first transmission gate and the photoelectric conversion region may be formed in a substrate, and wherein the first transmission gate overlaps the photoelectric conversion region when seen from a first surface of the substrate.

In some implementations, the photocharge may migrate from the photoelectric conversion region to the first floating diffusion region according to a voltage level of a first transmission signal applied to the first transmission gate.

In some implementations, the photocharge may migrate from the first floating diffusion region to the second floating diffusion region according to the voltage level of a second transmission signal applied to the second transmission gate.

In some implementations, the first transmission signal may correspond to one of an active voltage level, an inactive voltage level and an anti-leakage voltage level, and a voltage level at the first transmission gate may be adjusted according to the voltage level of the first transmission signal.

In some implementations, when the photocharge is stored in the first floating diffusion region, the voltage level of the first transmission signal is the anti-leakage voltage level.

In some implementations, the first transmission gate and the second transmission gate may be formed in a substrate from a first surface of the substrate to certain depths in the substrate, and wherein an area of the first transmission gate at the first surface of the substrate is smaller than an area of the second transmission gate at the first surface of the substrate.

In some implementations, the first transmission gate may comprise a first gate electrode and a first gate dielectric layer, and the second transmission gate may comprise a second gate electrode and a second gate dielectric layer.

In accordance with another embodiment of the disclosed technology, an image sensing device may comprise: a photoelectric conversion region formed in a substrate and structured to convert incident light into photocharge corresponding to an optical image of an object; a first transmission gate structured to transfer the photocharge, the first transmission gate abutting on the photoelectric conversion region and extending from a first surface of the substrate; a second transmission gate structured to transfer the photocharge, the second transmission gate abutting on the first transmission gate and extending from the first surface of the substrate; a first floating diffusion region structured to store the photocharge and abutting on the first transmission gate and the second transmission gate; and a second floating diffusion region structured to store the photocharge and abutting on the second transmission gate, wherein the first floating diffusion region abuts on a side surface of the first transmission gate and a bottom surface of the second transmission gate.

In some implementations, the first transmission gate may transmit the photocharge generated by the photoelectric conversion region to the first floating diffusion region according to a voltage level of a first transmission signal applied to the first transmission gate.

In some implementations, the first transmission signal may correspond to one of an active voltage level, an inactive voltage level and an anti-leakage voltage level.

In some implementations, when the photocharge is stored in the first floating diffusion region, the first transmission signal may have the anti-leakage voltage level.

In some implementations, the second transmission gate may transmit the photocharge of the first floating diffusion region to the second floating diffusion region according to a voltage level of a second transmission signal applied to the second transmission gate.

In some implementations, the second transmission signal may correspond to one of an active voltage level and an inactive voltage level.

In another embodiment of the disclosed technology, an image sensing device may include: a first transmission gate configured to transfer photocharge, generated in a photoelectric conversion region, to a first floating diffusion region; and a second transmission gate configured to transfer the photocharge, stored in the first floating diffusion region, to a second floating diffusion region. The second transmission gate may abut on a side surface of the first transmission gate, the first floating diffusion region may abut on a bottom surface of the second transmission gate and the side surface of the first transmission gate, and the second floating diffusion region may abut on one surface of the second transmission gate, the one surface facing a surface on which the second transmission gate and the first transmission gate abut.

In another embodiment of the disclosed technology, an image sensing device may include: a photoelectric conversion region formed in a substrate; a first transmission gate abutting on the photoelectric conversion region, and extended from one surface of the substrate; a second transmission gate abutting on the first transmission gate, and extended from the one surface of the substrate; a first floating diffusion region abutting on the first transmission gate and the second transmission gate; and a second floating diffusion region abutting on the second transmission gate. The first floating diffusion region may abut on a side surface of the first transmission gate and a bottom surface of the second transmission gate.

It is to be understood that both the foregoing general description and the following detailed description of the disclosed technology are illustrative and explanatory and are intended to provide further explanation of the disclosure as claimed.

DETAILED DESCRIPTION

In accordance with the various embodiments, the unit pixel included in the image sensing device may include the plurality of transmission transistors each having the transmission gate, and thus perform a global shutter operation.

Furthermore, the image sensing device may identify the transmission signals applied to the first and second transmission gates included in the unit pixel, such that the photocharges generated in the photoelectric conversion region are easily stored and transmitted.

Furthermore, the first and second transmission gates may be located to abut on each other, and the first floating diffusion region having a smaller width than the second transmission gate may be disposed to abut on the bottom surface of the second transmission gate, which makes it possible to provide an image sensing device in which the size of the unit pixel is reduced and the channel length is increased.

In addition, it is possible to provide various effects which are directly or indirectly understood through this document.

Hereafter, various embodiments will be described with reference to the accompanying drawings. However, it should be understood that the present disclosure is not limited to specific embodiments, but includes various modifications, equivalents and/or alternatives. The embodiments of the present disclosure may provide various effects which can be directly/indirectly recognized through the present disclosure.

Figure 1:
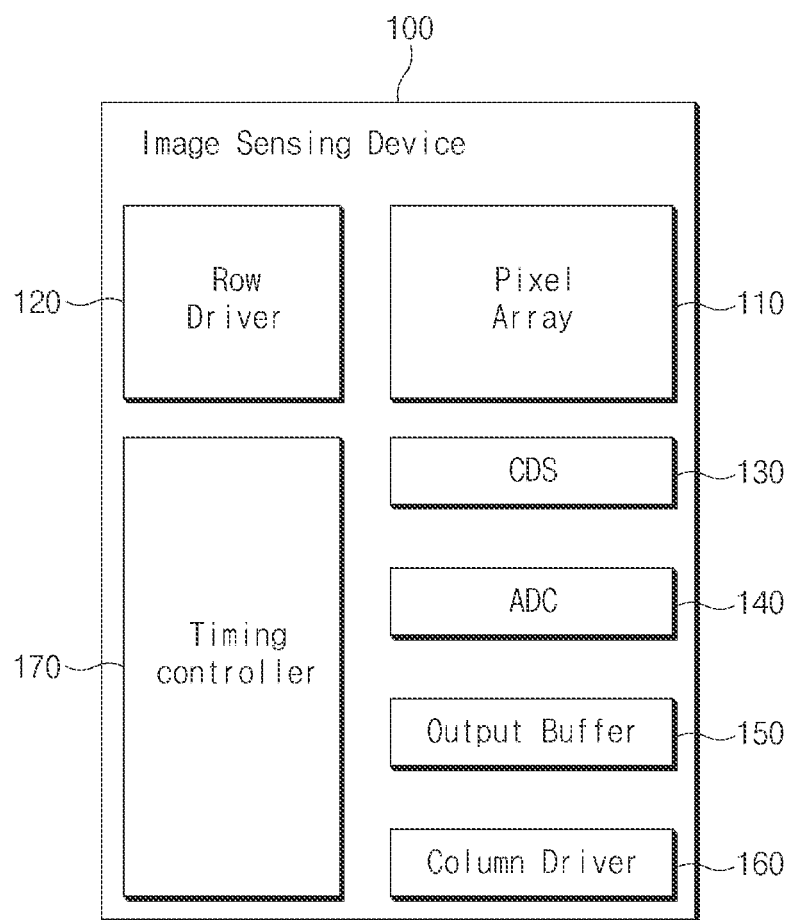
FIG. 1 is a block diagram illustrating an image sensing device based on some embodiments of the disclosed technology.

FIG. 1 is a block diagram illustrating an image sensing device 100 based on some embodiments of the disclosed technology.

Referring to FIG. 1, the image sensing device 100 may include a pixel array 110, a row driver 120, a CDS (Correlate Double Sampler) 130, an ADC (Analog-Digital Converter) 140, an output buffer 150, a column driver 160 and a timing controller 170. The components of the image sensing device 100 are only an example, and at least some of the components may be added or omitted, if necessary.

The pixel array 110 may include a plurality of unit pixels arranged at the respective intersections between a plurality of rows and a plurality of columns. In an embodiment, the plurality of unit pixels may be arranged in a 2D pixel array including rows and columns. In another embodiment, the plurality of unit image pixels may be arranged in a 3D pixel array. The plurality of unit pixels may convert optical signals into electrical signals on a unit pixel or pixel group basis, and the unit pixels within each pixel group may share at least a specific internal circuit. The pixel array 110 may receive a driving signal, including a row selection signal, a pixel reset signal and a transmission signal, from the row driver 120. According to the driving signal, the corresponding unit pixel of the pixel array 110 may be enabled to perform an operation corresponding to the row selection signal, the pixel reset signal or the transmission signal.

Based on commands and control signals which are supplied by the timing controller 170, the row driver 120 may enable the pixel array 110 to perform specific operations on the unit pixels included in the corresponding row. In an embodiment, the row driver 120 may select one or more unit pixels arranged at one or more rows of the pixel array 110. The row driver 120 may generate a row selection signal to select one or more rows among the plurality of rows.

The row driver 120 may sequentially enable the pixel reset signal and the transmission signal for pixels corresponding to the selected one or more rows. Thus, a reference signal and an image signal, which are analog signals generated from the respective pixels of the selected row, may be sequentially transferred to the CDS 130. The reference signal may be an electrical signal which is provided to the CDS 130 when a sensing node (e.g. floating diffusion region node) of a unit pixel is reset, and the image signal may be an electrical signal which is provided to the CDS 130 when photocharges generated by the unit pixel are accumulated in the sensing node. The reference signal indicating unique reset noise of the pixel and the image signal indicating the intensity of incident light may be collectively referred to as a pixel signal.

The CMOS image sensing device may sample a pixel signal twice in order to remove the difference between two samples, and thus use correlated double sampling to remove an undesired offset value of the pixel, such as fixed pattern noise. For example, through the correlated double sampling, the CMOS image sensing device may compare pixel output voltages acquired before and after photocharges generated by incident light are accumulated in the sensing node, and remove an undesired offset value, thereby measuring a pixel output voltage based on only the incident light. In an embodiment, the CDS 130 may sequentially sample and hold the reference signal and the image signal which are provided to each of the columns from the pixel array 110. That is, the CDS 130 may sample and hold the levels of the reference signal and the image signal which correspond to each of the columns of the pixel array 110.

The CDS 130 may transfer the reference signal and the image signal of each of the columns as a correlated double sampling signal to the ADC 140 on the basis of the control signal from the timing controller 170.

The ADC 140 may convert the corrected double sampling signal for each of the columns, outputted from the CDS 130, into a digital signal and output the digital signal. In an embodiment, the ADC 140 may be implemented as a ramp-compare type ADC. The ramp-compare type ADC may include a comparison circuit configured to compare an analog pixel signal and a ramp signal which rises or falls with the elapse of time, and a counter configured to perform a counting operation until the ramp signal is matched with the analog pixel signal. In an embodiment, the ADC 140 may convert the correlated double sampling signal for each of the columns, generated by the CDS 130, into a digital signal, and output the digital signal.

The ADC 140 may include a plurality of column counters corresponding to the respective columns of the pixel array 110. The columns of the pixel array 110 may be coupled to the respective column counters, and image data may be generated by converting the correlated double sampling signals, corresponding to the respective columns, into digital signals through the column counters. In another embodiment, the ADC 140 may include one global counter, and convert the correlated double sampling signals corresponding to the respective columns into digital signals using a global code provided from the global counter.

The output buffer 150 may temporarily hold the column-based image data provided from the ADC 140, and output the held image data. The output buffer 150 may temporarily store the image data outputted from the ADC 140 based on the control signal of the timing controller 170. The output buffer 150 may operate as an interface which compensates for a difference in transfer rate or processing speed from another device coupled to the image sensing device 100.

The column driver 160 may select a column of the output buffer 150 on the basis of the control signal of the timing controller 170, and control the output buffer 150 to sequentially output the image data which are temporarily stored in the selected column of the output buffer 150. In an embodiment, the column driver 160 may receive an address signal from the timing controller 170, generate a column selection signal on the basis of the address signal, and select a column of the output buffer 150, such that the image data are outputted to the outside from the selected column of the output buffer 150.

The timing controller 170 may control one or more of the row driver 120, the CDS 130, the ADC 140, the output buffer 150 and the column driver 160.

The timing controller 170 may provide one or more of the row driver 120, the CDS 130, the ADC 140, the output buffer 150 and the column driver 160 with a clock signal required for the operations of the respective components of the image sensing device 100, a control signal for timing control, and address signals for selecting a row or column. According to an embodiment, the timing controller 170 may include a logic control circuit, a phase locked loop (PLL) circuit, a timing control circuit, a communication interface circuit and the like.

Figure 2:
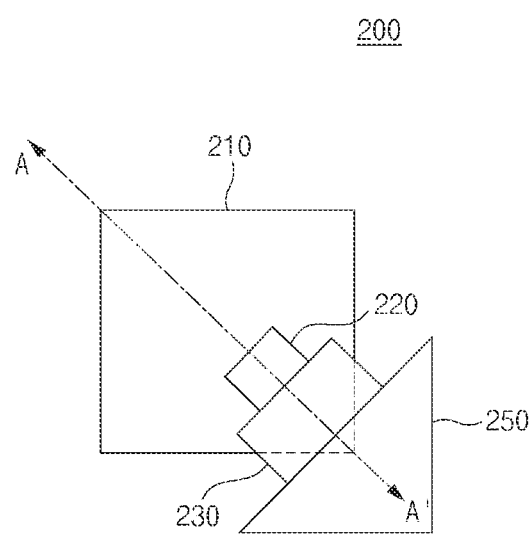
FIG. 2 is a diagram illustrating a part of a unit pixel included in the image sensing device based on some embodiments of the disclosed technology.

FIG. 2 is a diagram illustrating a part 200 of a unit pixel included in the image sensing device based on some embodiments of the disclosed technology. FIG. 2 is a plan view illustrating one surface of a substrate in which the unit pixel is located.

The unit pixel may be included in the pixel array 110 of FIG. 1. In an embodiment, the pixel array 110 may include a plurality of unit pixels arranged in rows and columns.

The unit pixel may include a photoelectric conversion region 210, a first transmission gate 220, a second transmission gate 230 and a second floating diffusion region 250. Although not illustrated in the drawings, the unit pixel may include a first floating diffusion region that abuts on the bottom surface of the second transmission gate 230. The unit pixel further includes a plurality of transistors in a transistor region.

The photoelectric conversion region 210 may generate photocharge corresponding to incident light. The photoelectric conversion region 210 may include an organic or inorganic photodiode. In another embodiment, the photoelectric conversion region 210 may include a photosensitive element such as a photo-gate.

In some embodiments of the disclosed technology, the photoelectric conversion region 210 may be formed in a semiconductor substrate, and include impurity regions (P-type impurity region and/or N-type impurity region) which have complementary conductive types and are stacked in a vertical direction.

The photoelectric conversion region 210 may include a portion that overlaps the first transmission gate 220, the second transmission gate 230, the first floating diffusion region and the second floating diffusion region 250. For example, the photoelectric conversion region 210 overlaps the first transmission gate 220, the second transmission gate 230, the first floating diffusion region and the second floating diffusion region 250 those are formed in a substrate, and the portion of the photoelectric conversion region 210 overlaps the first transmission gate 220, the second transmission gate 230, the first floating diffusion region and the second floating diffusion region 250 when seen from a top surface of the substrate. As a result, a light receiving area of the photoelectric conversion region 210 in the unit pixel may be secured.

The first transmission gate 220 may overlap the photoelectric conversion region 210, and thus photocharge generated in the photoelectric conversion region 210 may be easily migrated to the first floating diffusion region.

The second transmission gate 230 may abut on the first transmission gate 220. As the second transmission gate 230 is formed to abut on the first transmission gate 220, the degree of freedom in the layout of the unit pixel may be improved.

An area occupied by the first transmission gate 220 may be smaller than an area occupied by the second transmission gate 230. As the area of the second transmission gate 230 becomes larger than the area of the first transmission gate 220, it is possible to secure a region where the first floating diffusion region is disposed, under the second transmission gate 230.

When the second transmission gate 230 has a larger area than the first transmission gate 220, a second channel may be sufficiently secured between the first floating diffusion region and the second floating diffusion region 250, and photocharge may be easily transmitted between the first floating diffusion region and the second floating diffusion region 250.

The second transmission gate 230 may abut on the second floating diffusion region 250. In some embodiments of the disclosed technology, the second floating diffusion region 250 may have a triangle-shaped structure including a side that abuts on the second transmission gate 230 and has a larger length than the other sides. However, the scope of the present disclosure is not limited thereto. For example, at least some of the unit pixels may be shared pixels, and the second floating diffusion region 250 may have a polygonal shape such as a diamond or octagon.

In some implementations, a driving transistor, a reset transistor, a selection transistor may be located in the transistor region of the unit pixel. The features of the transistors included in the transistor region will be described below with reference to FIG. 4.

Figure 3:
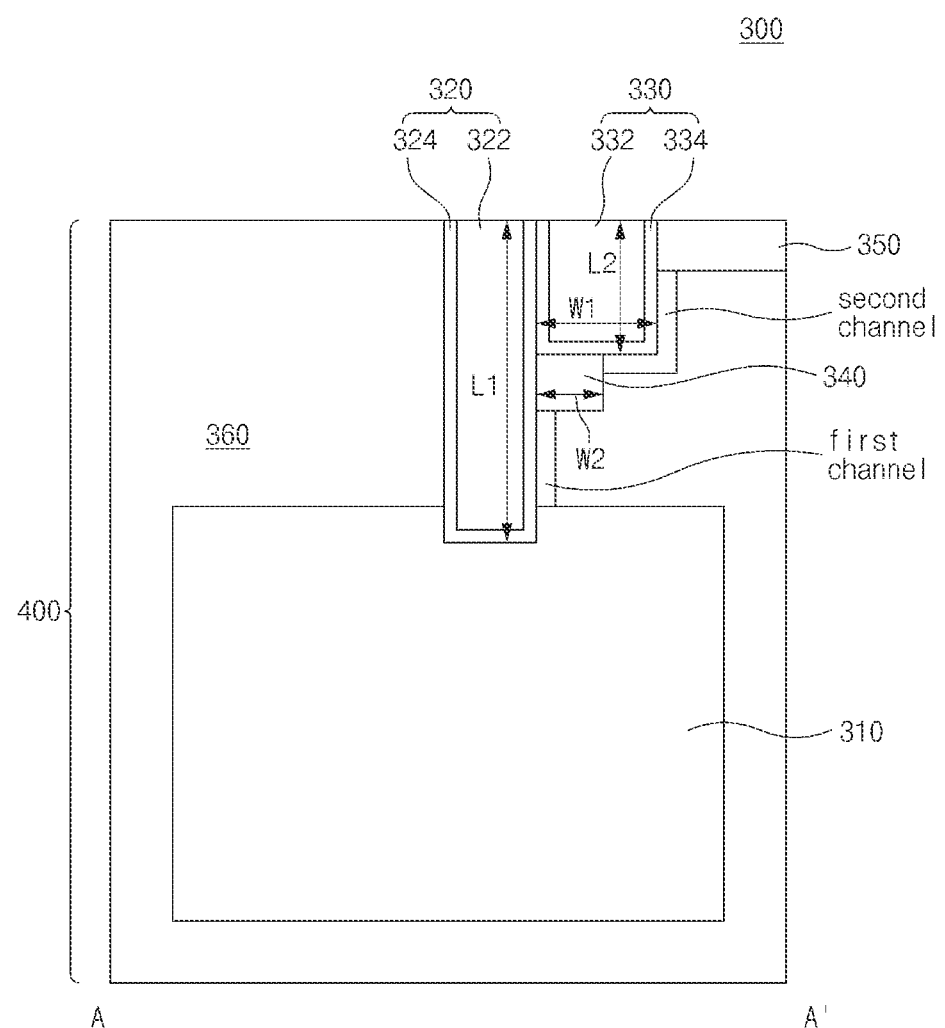
FIG. 3 is a cross-sectional view of the unit pixel taken along a first line A-A' of FIG. 2.

FIG. 3 illustrates a cross-section 300 of the unit pixel taken along a first line A-A' of FIG. 2.

A photoelectric conversion region 310 illustrated in FIG. 3 may correspond to the photoelectric conversion region 210 of FIG. 2, and a first transmission gate 320 of FIG. 3 may correspond to the first transmission gate 220 of FIG. 2. Furthermore, a second transmission gate 330 of FIG. 3 may correspond to the second transmission gate 230 of FIG. 2, and a second floating diffusion region 350 of FIG. 3 may correspond to the second floating diffusion region 250 of FIG. 2.

Referring to FIG. 3, the photoelectric conversion region 310, the first transmission gate 320, the second transmission gate 330, a first floating diffusion region 340, the second floating diffusion region 350 and a semiconductor region 360 are formed in a substrate 400.

In some implementations, the first transmission gate 320 includes a first gate electrode 322 and a first gate dielectric layer 324, and the second transmission gate 330 includes a second gate electrode 332 and a second gate dielectric layer 334.

The substrate 400 may include a semiconductor substrate or an epitaxial layer. The semiconductor substrate may include silicon or silicon doped with an impurity (e.g., a P-type or N-type impurity). The semiconductor region 360 may include an epitaxial layer or silicon or silicon doped with impurities in the substrate 400.

The photoelectric conversion region 310 may be formed in the substrate 400.

The photoelectric conversion region 310 may be formed to abut on the bottom surface of the first transmission gate 320. The photoelectric conversion region 310 may generate photocharge corresponding to incident light. The photocharge may be transmitted to the first floating diffusion region 340 from the photoelectric conversion region 310, according to the voltage level of a first transmission signal applied to the first transmission gate 320.

The first transmission gate 320 may be extended by a first length L1 toward the photoelectric conversion region 310 from one surface of the substrate. The first length L1 may correspond to the length by which the first transmission gate 320 is extended in a y-axis direction of FIG. 3.

The bottom surface of the first transmission gate 320 may abut on at least a part of the photoelectric conversion region 310, and at least a part of the first transmission gate 320 may be surrounded by the photoelectric conversion region 310.

The first transmission gate 320 may be formed in a trench shape from one surface of the semiconductor substrate. Referring to FIG. 3, in some implementations, the first transmission gate 320 is formed in a rectangular shape, whose top and bottom widths are equal to each other. In other implementations, the first transmission gate 320 may be formed in a trapezoidal shape, whose top and bottom widths are different from each other.

As the first transmission gate 320 is surrounded by the photoelectric conversion region 310, the contact area between the first transmission gate 320 and the photoelectric conversion region 310 may be increased, and the photocharge generated by the photoelectric conversion region 310 may be easily migrated to the first floating diffusion region 340.

The first transmission gate 320 may include the first gate electrode 322 and the first gate dielectric layer 324.

In some embodiments of the disclosed technology, the first gate electrode 322 may include a conductive material. The conductive material may include polysilicon or metal (e.g., copper or tungsten), for example. The first gate dielectric layer 324 may be formed to surround the first gate electrode 322. The first gate dielectric layer 324 may include a high-k dielectric material, such as silicon oxide and silicon nitride.

The first gate dielectric layer 324 may electrically isolate the first gate electrode 322 from the photoelectric conversion region 310, the second transmission gate 330 and the first floating diffusion region 340. The second transmission gate 330 may be extended by a second length L2 from one surface of the substrate toward the photoelectric conversion region 310. The second length L2 may correspond to the length by which the second transmission gate 330 extended in the y-axis direction of FIG. 3.

The second length L2 may be smaller than the first length L1 corresponding to the length of the first transmission gate 320. As the second length L2 is set to a smaller value than the first length L1, the first floating diffusion region 340 may be formed under the second transmission gate 330.

The second transmission gate 330 may abut on a side surface of the first transmission gate 320. According to an embodiment, the side surface may indicate a plane perpendicular to an x-axis.

The second transmission gate 330 may be formed in a trench shape from one surface of the semiconductor substrate. Referring to FIG. 3, in some implementations, the second transmission gate 330 is formed in a rectangular shape, whose top and bottom widths are equal to each other. In other implementations, the second transmission gate 330 may be formed in a trapezoidal shape, whose top and bottom widths are different from each other.

The second transmission gate 330 may include the second gate electrode 332 and the second gate dielectric layer 334.

In some embodiments of the disclosed technology, the second gate electrode 332 may include a conductive material. The conductive material may include polysilicon or metal (e.g., copper or tungsten), for example. The second gate dielectric layer 334 may be formed to surround the second gate electrode 332. The second gate dielectric layer 334 may include a high-k dielectric material, such as silicon oxide and silicon nitride.

The second gate dielectric layer 334 may electrically isolate the second gate electrode 332 from the first transmission gate 320, the first floating diffusion region 340 and the second floating diffusion region 350.

The first floating diffusion region 340 may abut on the side surface of the first transmission gate 320, and abut on the bottom surface of the second transmission gate 330. In other words, among surfaces included in the first floating diffusion region 340, a surface perpendicular to the x-axis may abut on the first transmission gate 320, and another surface perpendicular to the y-axis may abut on the second transmission gate 330.

The first floating diffusion region 340 may include an impurity (e.g., N-type impurity)-doped region. According to an embodiment, the first floating diffusion region 340 may include impurity (e.g., N-type impurity)-doped regions which have different concentrations and are stacked therein.

When the voltage level of a first transmission signal applied to the first transmission gate 320 is an active voltage level, a first channel may be formed between the first floating diffusion region 340 and the photoelectric conversion region 310. Furthermore, when the voltage level of the first transmission signal applied to the first transmission gate 320 is an inactive voltage level, the first channel may not be formed between the first floating diffusion region 340 and the photoelectric conversion region 310.

In some embodiments of the disclosed technology, the first channel may be extended from the photoelectric conversion region 310 toward the first floating diffusion region 340 in the y-axis direction.

Photocharge generated in the photoelectric conversion region 310 may migrate to the first floating diffusion region 340 along the first channel. The photoelectric conversion region 310, the first transmission gate 320 and the first floating diffusion region 340 may function as a first transmission transistor, the photoelectric conversion region 310 and the first floating diffusion region 340 may function as both terminals of the first transmission transistor, and the first transmission gate 320 may function as the gate of the first transmission transistor.

The second floating diffusion region 350 may include an impurity (e.g., N-type impurity)-doped region. According to an embodiment, the second floating diffusion region 350 may include impurity (e.g., N-type impurity)-doped regions which have different concentrations and are stacked therein.

The second floating diffusion region 350 may be doped with an impurity having a higher concentration than that of the first floating diffusion region 340. As the second floating diffusion region 350 is doped with an impurity having a higher concentration than that of the first floating diffusion region 340, a potential gradient may be formed between the first floating diffusion region 340 and the second floating diffusion region 350.

Since photocharge migrate from where the potential is high to where the potential is low, photocharge may smoothly migrate from the first floating diffusion region 340 whose potential is high due to the low-concentration doping to the second floating diffusion region 350 whose potential is relatively low.

When the voltage level of a second transmission signal applied to the second transmission gate 330 is the active voltage level, a second channel may be formed between the first floating diffusion region 340 and the second floating diffusion region 350. Furthermore, when the voltage level of the second transmission signal applied to the second transmission gate 330 is the inactive voltage level, the second channel may not be formed between the first floating diffusion region 340 and the second floating diffusion region 350.

The second channel may be disposed among the first floating diffusion region 340, the second floating diffusion region 350 and the second transmission gate 330.

In an embodiment of the disclosed technology, the width W2 of the first floating diffusion region 340 may be smaller than the width W1 of the second transmission gate 330.

Since the width W2 of the first floating diffusion region 340 is smaller than the width W1 of the second transmission gate 330, the second channel formed between the first floating diffusion region 340 and the second floating diffusion region 350 may be formed across parts of the bottom and side surfaces of the second transmission gate 330.

In other words, the second channel may include a lateral region which is formed along the bottom surface of the second transmission gate 330 and extended in the x-axis direction, and a vertical region which is formed along the side surface of the second transmission gate 330 and extended in the y-axis direction.

As the second channel includes the lateral region and the vertical region, the length of the second channel may be secured even though the unit pixel is reduced in size.

The photocharges are temporarily stored in the first floating diffusion region 340 and then migrate to the second floating diffusion region 350 along the second channel. The first floating diffusion region 340, the second transmission gate 330 and the second floating diffusion region 350 may function as a second transmission transistor, the first floating diffusion region 340 and the second floating diffusion region 350 may function as both terminals of the second transmission transistor, and the second transmission gate 330 may function as the gate of the second transmission transistor.

In another embodiment of the disclosed technology, the first transmission transistor may prevent the photocharges, temporarily stored in the first floating diffusion region 340, from leaking to the photoelectric conversion region 310.

For example, before the photocharges are transferred from the first floating diffusion region 340 to the second floating diffusion region 350 after the photocharges are temporarily stored in the first floating diffusion region 340, the first transmission signal having an anti-leakage voltage level may be applied to the first transmission gate 320. The anti-leakage voltage level may have the opposite sign to the active voltage level.

When the first transmission signal having the anti-leakage voltage level is applied to the first transmission gate 320, the first transmission transistor may function as a potential barrier between the photoelectric conversion region 310 and the first floating diffusion region 340, and prevent photocharges from leaking from the first floating diffusion region 340 to the photoelectric conversion region 310.

Figure 4:
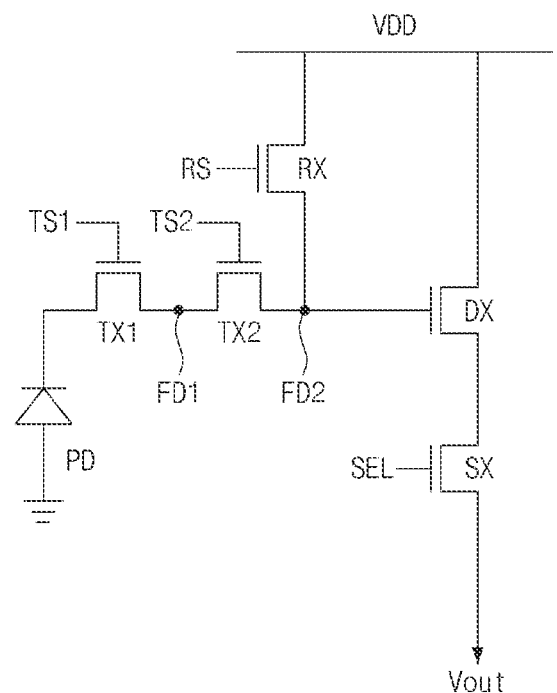
FIG. 4 is an example circuit diagram of the unit pixel based on some embodiments of the disclosed technology.

FIG. 4 is an example circuit diagram of the unit pixel based on some embodiments of the disclosed technology.

FIG. 4 illustrates the coupling relationships among a photoelectric conversion region PD, a first transmission transistor TX1, a first floating diffusion region FD1, a second transmission transistor TX2, a second floating diffusion region FD2, a reset transistor RX, a driving transistor DX and a selection transistor SX.

Furthermore, FIG. 4 illustrates signals TS1, TS2, RS and SEL applied to the respective transistors (e.g., TX1, TX2, RX and SX).

The first transmission transistor TX1 may be located between the photoelectric conversion region PD and the first floating diffusion region FD1.

A first transmission signal TS1 may be applied to the first transmission transistor TX1. According to the voltage level of the first transmission signal TS1, photocharges generated in the photoelectric conversion region PD may be transferred to the first floating diffusion region FD1. For example, the first transmission signal TS1 may have the active voltage level, the inactive voltage level or the anti-leakage voltage level.

When the first transmission signal TS1 has the active voltage level, the photocharges may be transferred from the photoelectric conversion region PD to the first floating diffusion region FD1.

The photocharges transferred to the first floating diffusion region FD1 may be temporarily stored until a second transmission signal TS2 having the active voltage level is applied to the second transmission transistor TX2.

The unit pixel may perform a global shutter operation through the first floating diffusion region FD1 in which the photocharges are temporarily stored.

The global shutter operation may enable all the unit pixels included in the pixel array (e.g., 110 of FIG. 1) to start and end the exposure to incident light at the same time frame, and for each row of the pixel array 110, output pixel signals corresponding to light incident during the same time frame.

During the global shutter operation, the image sensing device 100 may generate an image signal for a targeted object based on pixel signals corresponding to the light incident during the same time frame, thereby preventing image distortion.

During the global shutter operation, all of the unit pixels included in the pixel array 110 may be reset at the same time, and each of the unit pixels may generate photocharge corresponding to incident light received during the same time frame.

The photocharges corresponding to the incident light received during the same time frame may be temporarily stored in the first floating diffusion regions (e.g., FD1) included in the respective unit pixels. Then, the photocharges temporarily stored in the first floating diffusion region FD1 may be transferred to the second floating diffusion region FD2, when the second transmission signal TS2 having the active voltage level is applied to the second transmission transistor TX2. The pixel signals corresponding to the photocharges transmitted to the second floating diffusion region FD2 may be outputted for each row of the pixel array 110.

The second transmission transistor TX2 may be located between the first floating diffusion region FD1 and the second floating diffusion region FD2.

The second transmission signal TS2 may be applied to the second transmission transistor TX2. According to the voltage level of the second transmission signal TS2, the photocharges which have been stored in the first floating diffusion region FD1 may be transferred to the second floating diffusion region FD2. For example, the second transmission signal TS2 may have the active voltage level or the inactive voltage level. In another embodiment, while photocharges are temporarily stored in the first floating diffusion region FD1, the first transmission signal TS1 applied to the first transmission transistor TX1 may have the anti-leakage voltage level.

When the first transmission signal TS1 has the anti-leakage voltage level, the first transmission transistor TX1 may function as a voltage barrier between the photoelectric conversion region PD and the first floating diffusion region FD1. As the first transmission transistor TX1 functions as a voltage barrier, it is possible to prevent photocharge leakage from the first floating diffusion region FD1 to the photoelectric conversion region PD.

The photocharges transmitted to the second floating diffusion region FD2 may be amplified by the driving transistor DX. The second floating diffusion region FD2 may be coupled to the gate of the driving transistor DX.

Furthermore, the second floating diffusion region FD2 may be coupled to one terminal of the reset transistor RX. The other terminal of the reset transistor RX may be coupled to a pixel voltage VDD, and the reset transistor RX may reset the photoelectric conversion region PD and the floating diffusion regions FD1 and FD2, included in the unit pixel, to the pixel voltage according to the voltage level of a reset control signal RS applied to the gate of the reset transistor RX. As the photoelectric conversion region PD and the floating diffusion regions FD1 and FD2 are reset to the pixel voltage, it is possible to accurately measure the amount of photocharge generated in response to incident light.

When the reset control signal RS has the active voltage level, the first and second transmission signals TS1 and TS2 may have the active voltage level. When the reset control signal RS, the first transmission signal TS1 and the second transmission signal TS2 have the active voltage level, the photoelectric conversion region PD, the first floating diffusion region FD1 and the second floating diffusion region FD2 may be electrically coupled and reset to the pixel voltage VDD.

The selection transistor SX may selectively output the signal amplified by the driving transistor DX, according to a selection control signal SEL. A signal outputted from one terminal of the selection transistor SX may be referred to as a pixel signal Vout.

The image sensing device 100 may generate image information through the pixel signal Vout outputted from each of the unit pixels.

FIGS. 5 to 8 are diagrams that illustrate examples of photocharge migration that occurs in response to an electric potential or voltage change and the operations of the transmission transistors TX1 and TX2 based on some embodiments of the disclosed technology.

Figure 5:
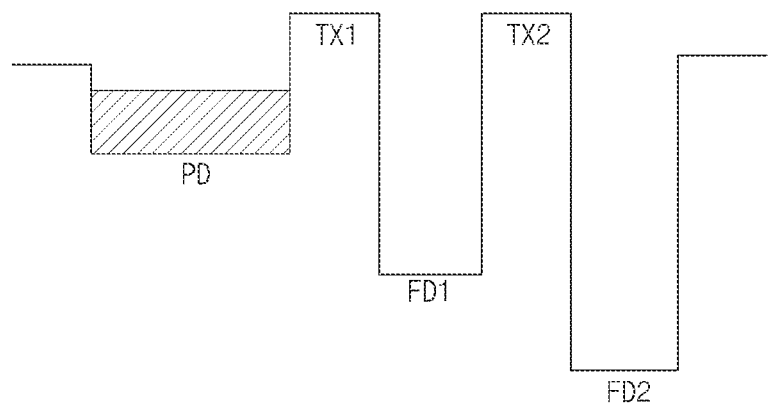
FIG. 5 illustrates an example of photocharge migration that occurs in response to an electric potential or voltage change and the operations of transmission transistors based on some embodiments of the disclosed technology.

FIG. 5 illustrates relative electric potential and photocharge in a time period in which photocharge corresponding to incident light is generated in the photoelectric conversion region PD, after the unit pixel is reset to the pixel voltage. When an electric potential gradient is formed, photocharges may migrate from where the electric potential is high to where the electric potential is low.

In an embodiment, the first floating diffusion region FD1 may have a lower electric potential than the photoelectric conversion region PD, and the second floating diffusion region FD2 may have a lower electric potential than the first floating diffusion region FD1.

In an embodiment, the photoelectric conversion region PD of the image sensing device 100, which performs the global shutter operation, may generate photocharge corresponding to light incident on the photoelectric conversion region PD during an exposure time.

During the time period in which the photocharge corresponding to the incident light is generated in the photoelectric conversion region PD, the first transmission signal having the inactive voltage level may be applied to the first transmission transistor TX1, and the second transmission signal having the inactive voltage level may be applied to the second transmission transistor TX2.

Figure 6:
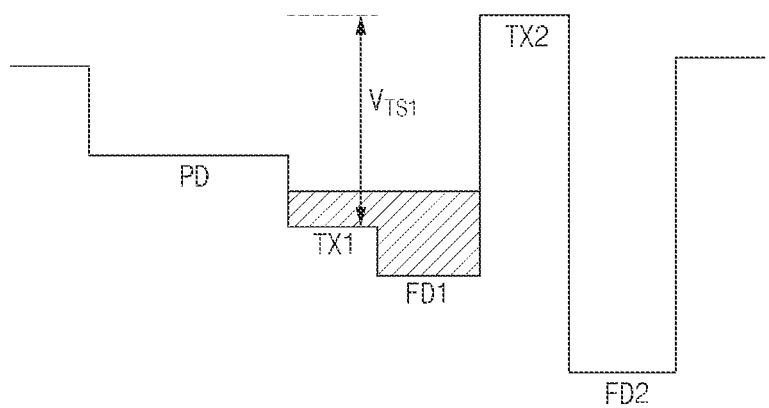
FIG. 6 illustrates another example of photocharge migration that occurs in response to an electric potential or voltage change and the operations of transmission transistors based on some embodiments of the disclosed technology.

FIG. 6 illustrates the electric potential of the time period in which the first transmission signal having the active voltage level is applied to the first transmission transistor TX1, and photocharges migrate from the photoelectric conversion region PD to the first floating diffusion region FD1.

As the first transmission signal having the active voltage level is applied to the first transmission transistor TX1, the voltage electric potential of the first transmission transistor TX1 may be decreased as much as a first electric potential $V_{TS1}$.

As the voltage potential of the first transmission transistor TX1 is decreased, an electric potential gradient may be formed from the photoelectric conversion region PD to the first transmission transistor TX1 and the first floating diffusion region FD1, and photocharges may migrate from the photoelectric conversion region PD to the floating diffusion region FD1. During the time period, the second transmission signal applied to the second transmission transistor TX2 may have the inactive voltage level.

Figure 7:
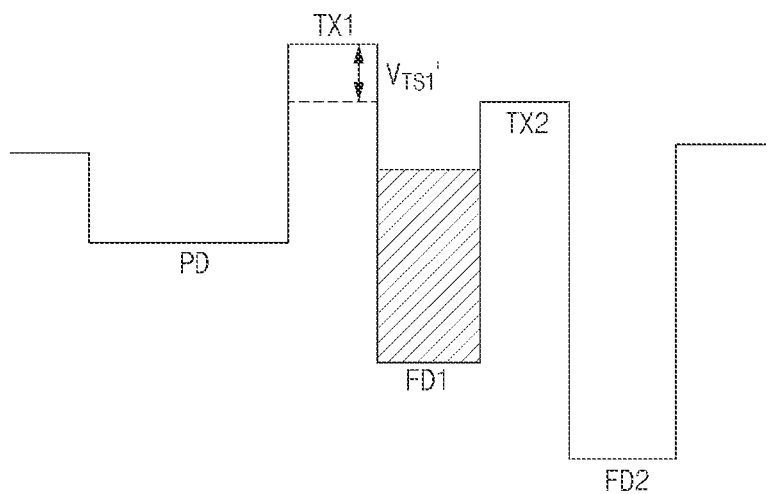
FIG. 7 illustrates another example of photocharge migration that occurs in response to an electric potential or voltage change and the operations of transmission transistors based on some embodiments of the disclosed technology.

FIG. 7 illustrates the electric potential of the time period in which photocharges are temporarily stored in the first floating diffusion region FD1, and the first transmission signal having the anti-leakage voltage level is applied to the first transmission transistor TX1. At this time, the second transmission signal applied to the second transmission transistor TX2 may have the inactive voltage level.

As the first transmission signal having the anti-leakage voltage level is applied to the first transmission transistor TX1, the voltage or electric potential of the first transmission transistor TX1 may be increased as much as an anti-leakage potential $V_{TS1'}$. As the voltage or electric potential of the first transmission transistor TX1 is increased, it is possible to prevent the formation of the electric potential gradient from the first floating diffusion region FD1 to the photoelectric conversion region PD. Therefore, when the first transmission signal having the anti-leakage voltage level is applied to the first transmission transistor TX1, the photocharges which are temporarily stored in the first floating diffusion region FD1 may be prevented from leaking to the photoelectric conversion region PD.

The photocharges generated in the photoelectric conversion region PD may be temporarily stored in the first floating diffusion region FD1, and the image sensing device including the first floating diffusion region FD1 may perform the global shutter operation of outputting pixel signals corresponding to the same exposure time from the plurality of unit pixels included in the pixel array.

When the photocharge leaks from the first floating diffusion region FD1 to the photoelectric conversion region PD before a pixel signal corresponding to the photocharge stored in the first floating diffusion region FD1 is outputted, the outputted pixel signal may be distorted.

Therefore, by increasing the voltage or electric potential of the first transmission transistor TX as much as the anti-leakage potential $V_{TS1'}$, it is possible to prevent the leakage of the photocharge before the pixel signal is outputted and prevent the distortion of the pixel signal.

Figure 8:
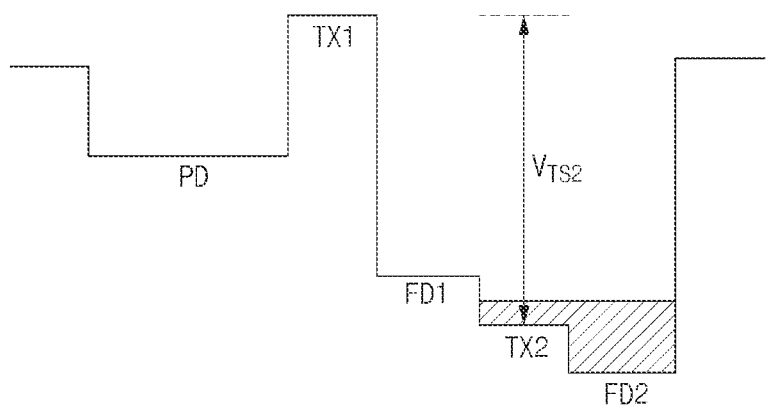
FIG. 8 illustrates another example of photocharge migration that occurs in response to an electric potential or voltage change and the operations of transmission transistors based on some embodiments of the disclosed technology.

FIG. 8 illustrates the electric potential of the time period in which the second transmission signal having the active voltage level is applied to the second transmission transistor TX2, and photocharge migrates from the first floating diffusion region FD1 to the second floating diffusion region FD2. As the second transmission signal having the active voltage level is applied to the second transmission transistor TX2, the voltage or electric potential of the second transmission transistor TX2 may be decreased as much as a second electric potential $V_{TS2}$.

As the voltage or electric potential of the second transmission transistor TX2 is decreased, an electric potential gradient may be formed from the first floating diffusion region FD1 to the second transmission transistor TX2 and the second floating diffusion region FD2, and photocharges may migrate from the first floating diffusion region FD1 to the second floating diffusion region FD2. During the time period, the first transmission signal applied to the first transmission transistor TX1 may have the inactive voltage level.

Then, pixel signals corresponding to the photocharges having migrated to the second floating diffusion region FD2 may be outputted from the respective unit pixels.

While various embodiments have been described above, it will be understood the disclosed embodiments are merely examples of certain implementations. Accordingly, various modifications of the image sensing device described herein and other embodiments can be made based on what is disclosed and/or illustrated in this patent document.

What is claimed is:

1. An image sensing device comprising:
a photoelectric conversion region formed in a substrate and structured to convert incident light into photocharge corresponding to an optical image of an object;
a first transmission gate formed in the substrate and structured to transfer the photocharge generated by the photoelectric conversion region to a first floating diffusion region structured to store the photocharge; and
a second transmission gate formed in the substrate and structured to transfer the photocharge transferred to the first floating diffusion region to a second floating diffusion region structured to store the photocharge for readout,
wherein a first side surface of the second transmission gate abuts on a side surface of the first transmission gate, the first floating diffusion region abuts on a bottom surface of the second transmission gate and the side surface of the first transmission gate, and the second floating diffusion region abuts on a second side surface of the second transmission gate facing away from the first side surface of the second transmission gate.

2. The image sensing device of claim 1, wherein the first transmission gate has a first length, the second transmission gate has a second length, and wherein the first length is larger than the second length.

3. The image sensing device of claim 1, further comprising a first channel abutting on the photoelectric conversion region, the first floating diffusion region and the first transmission gate.

4. The image sensing device of claim 1, further comprising a second channel abutting on the first floating diffusion region, the second floating diffusion region and the second transmission gate.

5. The image sensing device of claim 4, wherein the second channel extends along a portion of the bottom surface of the second transmission gate and a portion of the second side surface of the second transmission gate.

6. The image sensing device of claim 1, wherein the second transmission gate has a larger width than the first floating diffusion region.

7. The image sensing device of claim 1, wherein the first transmission gate abuts on at least a part of the photoelectric conversion region.

8. The image sensing device of claim 7, wherein the first transmission gate overlaps the photoelectric conversion region when seen from a first surface of the substrate.

9. The image sensing device of claim 1, wherein the photocharge migrates from the photoelectric conversion region to the first floating diffusion region according to a voltage level of a first transmission signal applied to the first transmission gate.

10. The image sensing device of claim 9, wherein the first transmission signal corresponds to one of an active voltage level, an inactive voltage level and an anti-leakage voltage level, and a voltage level at the first transmission gate is adjusted according to the voltage level of the first transmission signal.

11. The image sensing device of claim 10, wherein, in a case that the photocharge is stored in the first floating diffusion region, the voltage level of the first transmission signal is the anti-leakage voltage level.

12. The image sensing device of claim 1, wherein the photocharge migrates from the first floating diffusion region to the second floating diffusion region according to a voltage level of a second transmission signal applied to the second transmission gate.

13. The image sensing device of claim 1, wherein the first transmission gate and the second transmission gate are formed in the substrate from a first surface of the substrate to certain depths in the substrate, and wherein an area of the first transmission gate at the first surface of the substrate is smaller than an area of the second transmission gate at the first surface of the substrate.

14. The image sensing device of claim 1, wherein the first transmission gate comprises a first gate electrode and a first gate dielectric layer, and the second transmission gate comprises a second gate electrode and a second gate dielectric layer.

15. An image sensing device comprising:

a photoelectric conversion region formed in a substrate and structured to convert incident light into photocharge corresponding to an optical image of an object;

a first transmission gate structured to transfer the photocharge, the first transmission gate abutting on the photoelectric conversion region and extending from a first surface of the substrate;

a second transmission gate structured to transfer the photocharge, the second transmission gate abutting on the first transmission gate and extending from the first surface of the substrate;

a first floating diffusion region structured to store the photocharge and abutting on the first transmission gate and the second transmission gate; and a second floating diffusion region structured to store the photocharge and abutting on the second transmission gate, wherein the first floating diffusion region abuts on a side surface of the first transmission gate and a bottom surface of the second transmission gate.

16. The image sensing device of claim 15, wherein the first transmission gate transmits the photocharge generated by the photoelectric conversion region to the first floating diffusion region according to a voltage level of a first transmission signal applied to the first transmission gate.

17. The image sensing device of claim 16, wherein the first transmission signal corresponds to one of an active voltage level, an inactive voltage level and an anti-leakage voltage level.

18. The image sensing device of claim 17, wherein when the photocharge is stored in the first floating diffusion region, the first transmission signal has the anti-leakage voltage level.

19. The image sensing device of claim 15, wherein the second transmission gate transmits the photocharge of the first floating diffusion region to the second floating diffusion region according to a voltage level of a second transmission signal applied to the second transmission gate.

20. The image sensing device of claim 19, wherein the second transmission signal corresponds to one of an active voltage level and an inactive voltage level.

* * * * *